(12) United States Patent
Cho

(10) Patent No.: US 11,010,531 B2
(45) Date of Patent: May 18, 2021

(54) METHOD OF DESIGN QUALITY THROUGH THE CONSISTENCY CHECK AND DESIGN RULE CHECK OF ENGINEERING DATA OF 3D CAD MODEL FOR PLANT ENGINEERING

(71) Applicant: PlantAsset Technology Inc., Seoul (KR)

(72) Inventor: Siyeon Cho, Yongin-si (KR)

(73) Assignee: PLANTASSET TECHNOLOGY INC., Seoul (KR)

( * ) Notice: Subject to any disclaimer, the term of this patent is extended or adjusted under 35 U.S.C. 154(b) by 0 days.

(21) Appl. No.: 16/728,778

(22) Filed: Dec. 27, 2019

(65) Prior Publication Data

US 2020/0210638 A1 Jul. 2, 2020

(30) Foreign Application Priority Data

Dec. 28, 2018 (KR) .................. 10-2018-0172543

(51) Int. Cl.
*G06F 30/398* (2020.01)
*G06F 30/394* (2020.01)
*G06K 9/62* (2006.01)

(52) U.S. Cl.
CPC .......... *G06F 30/398* (2020.01); *G06F 30/394* (2020.01); *G06K 9/6267* (2013.01)

(58) Field of Classification Search
CPC .... G06F 30/398; G06F 30/394; G06K 9/6267
USPC ........................................................ 716/52
See application file for complete search history.

(56) References Cited

U.S. PATENT DOCUMENTS

| 10,275,843 | B2 * | 4/2019 | Shike | G06Q 10/06313 |
|---|---|---|---|---|
| 2002/0129001 | A1 * | 9/2002 | Levkoff | G06F 30/13 |
| 2009/0187384 | A1 * | 7/2009 | Nonaka | G06F 30/13 703/1 |
| 2018/0276319 | A1 * | 9/2018 | Tierney | G06F 16/90335 |
| 2018/0322694 | A1 * | 11/2018 | Byers | G06T 17/05 |
| 2020/0201285 | A1 * | 6/2020 | Hirooka | G06F 30/10 |

FOREIGN PATENT DOCUMENTS

| KR | 101135274 B1 | 4/2012 |
|---|---|---|
| KR | 101490311 B1 | 2/2015 |
| KR | 101767230 B1 | 8/2017 |
| KR | 101769433 B1 | 8/2017 |

* cited by examiner

*Primary Examiner* — Suresh Memula
(74) *Attorney, Agent, or Firm* — Rabin & Berdo, P.C.

(57) ABSTRACT

The present invention can determine in advance whether the design RULE is violated by checking the design conditions and design requirements required by the client and the project in the plant engineering stage on the 3D CAD model. The present invention can improve the design quality of plant engineering and minimizing the modification of the drawings occurring during construction by checking whether the various data of the vendor drawings received by the EPC company are accurately reflected to the 3D CAD modeling design.

11 Claims, 17 Drawing Sheets

(a)　　　　　　　　　(b)

METHOD OF DESIGN QUALITY THROUGH THE CONSISTENCY CHECK AND DESIGN RULE CHECK OF ENGINEERING DATA OF 3D CAD MODEL FOR PLANT ENGINEERING

CROSS-REFERENCE TO RELATED APPLICATION

This application claims under 35 U.S.C. § 119(a) the benefit of priority to Korean Patent Application No. 10-2018-0172543 filed on Dec. 28, 2018, the entire contents of which are incorporated herein by reference.

BACKGROUND

(a) Technical Field

The present invention relates to a design quality improvement method for improving design quality of plant engineering by examining the design conditions and design requirements of the client and the project on the 3D CAD model design in the plant engineering stage, and by checking whether various data and information (hereinafter referred to as 'engineering data') to be included in data sheets and equipment supplier documents (hereinafter referred to as 'vendor drawings') which EPC company receives are accurately reflected in the 3D CAD model design.

(b) Background Art

Plant engineering is designed through 3D CAD modeling to meet design conditions and design requirements in all fields (piping, electricity, instrumentation, air conditioning, structure, civil engineering) for the construction of large-scale plants.

3D CAD models should reflect engineering data along with P & ID (Piping & Instrument Diagram) requirements. There is a problem it is not easy to check the reflection of engineering data from 3D CAD modeled data problem since 3D CAD modeling is done by engineers.

In addition, engineering data may change from time to time as the change of the plant conditions during the plant engineering phase. As the change of the plant conditions, changes in P & ID and engineering data are essential, and the changed data must be reflected in the 3D CAD model to prevent design error. The engineering data is included in the various design data sheets and equipment supplier documents (Vendor Drawing) received at the stage of engineering, which should be reflected in the 3D CAD model. In addition, the engineering data can be continuously changed as the engineering design progresses, so that engineering data based on the latest data should be reflected in the 3D CAD model to prevent construction errors.

In addition, it is very important how quickly and accurately the design conditions or design requirements required by client is reflected in the design in terms of the quality of the 3D CAD model. These design conditions and design requirements are defined as "RULE". Therefore, in order to check the design quality, the RULE must be defined correctly first and then proceed according to the defined RULE. The method of checking various design qualities using conventional 3D CAD is as follows. 1) A 3D CAD engineer studies the RULE provided by the client. 2) Each engineer does the manual check for the RULE before performing the 30% Review, 60% Review, and 90% Review, which are step by step inspection of the client for 3D CAD drawings. 3) The parts that cannot be checked in the manual check are created as a punch list at the meeting with the client. 4) The parts that cannot be checked in the meeting with the client just go to the construction stage, which appear to be a lot of problems when constructing, and waste a lot of money and time because it must reflect the RULE through the site redesign.

The reason why this design RULE check is performed by manual is that there are various RULEs for each project, but there is no solution for defining and checking RULE for each project, and nevertheless plant engineering is performed by the collaboration of CAD engineers, there was no method or system to be managed with integration systematically for the information on actual design.

For this reason, in order to improve design quality, efforts have been made to manage various RULEs with integration, and various attempts have been made to find RULE check methods that are more simply and easily accessible by engineers.

SUMMARY OF THE DISCLOSURE

The present invention has been made in an effort to solve the above-described problems associated with prior art.

The present invention provides a way to improve design quality of 3D CAD model by checking whether various engineering data and information such as vendor drawings received at the plant engineering stage are accurately reflected in 3D CAD models.

In addition, the present invention provides a way to improve design quality of 3D CAD models through design RULE check for plant engineering, which can maximize design quality improvement and save time and cost when constructing a plant by pre-defined and automatically checking and managing pre-defined design RULE automatically in various 3D CAD modeling data created in the plant engineering stage.

To achieve the above objects, the present invention provides an improvement method for design quality through consistency check and design RULE check of 3D CAD model of engineering data for plant engineering using a design RULE data server, a vendor data server and a 3D CAD modeling data server, which comprises: (A) Checking whether to reflect the design RULE to 3D CAD model comprises: Registering a project name with the design RULE data server; Inputting a design RULE for the registered project by category; Designating and storing a value in the input design RULE; Checking whether to violate the design RULE by applying the design RULE value to 3D CAD model; and Outputting a result of the checked RULE; And (b) Checking the engineering data consistency of 3D CAD model comprises: Collecting and classifying vendor drawings submitted in the form of a file by the equipment manufacturer or the equipment supplier; Analyzing data by data mining techniques and extracting target data from the collected and classified vendor drawings; Searching 3D CAD modeling data matched with the extracted target data and mapping the searched 3D CAD modeling data and the extracted target data; Checking the consistency between the mapped 3D CAD modeling data and the extraction target data; and Reporting the results of the inspection, changing the 3D CAD modeling data, or providing or transmitting the results to the user, when the consistency check is completed.

In the present invention, inputting the design RULE by category is inputting as divided into the design and engineering, operation, maintenance and safety, wherein the design RULE by category can be used as it is, added or deleted in design RULE registered in the design RULE data server.

In the present invention, designating and storing the design RULE value is designating and storing the design RULE value to the pipe routing type to which the design RULE is applied in the 3D CAD modeling data, or designating and storing the design RULE value to a predetermined routing type object according to type, direction and location of each piping component in the design RULE data server.

In the present invention, designating and storing the design RULE value is designating and storing the design RULE value to the machine type to which the design RULE is applied in the 3D CAD modeling data, or designating and storing the design RULE value to the machine type which may be matched with the predetermined machine type in the design RULE data server after it is recognized by the characteristics of the components such as tag rules and nozzles of each machine.

In the present invention, designating and storing the design RULE value may include designating a type and a position value at which the piping components such as vents, drains or drip legs should exist, designating the distance or the span between one component and another adjacent component, designating the engineering values to be observed for one component, designating the position values of the components required for operation such as the position of the valve stem, designating the volume for the workspace and movement path for an operator's operation, or designating the volume required for maintenance.

In the present invention, checking whether to violate the design RULE may include recognizing the dimension, direction and spatial information of one component and the dimension, direction and spatial information of another adjacent component from the 3D CAD modeling data and checking whether to violate by comparing the designated design RULE value with the value of the distance or the span between one component and another adjacent component.

In collecting and classifying the vendor drawings of the present invention, the vendor drawings are submitted by the form of a PDF file, and the information on the manufacturer and equipment type is collected and classified from the PDF file.

In the present invention, analyzing and extracting data by the data mining technique may include extracting dimension and shape data of a two-dimensional drawing for equipment and various text information data of the drawing from vendor drawings collected and classified by manufacturer and equipment type; and filtering and extracting the extracted data into necessary target data by analyzing the extracted data.

In the present invention, searching 3D CAD modeling data matched with the extracted target data may include searching 3D CAD modeling data that is matched using as keywords the data for the area of the equipment and the name of the equipment, and mapping of the searched 3D CAD modeling data and the extracted data may include mapping elements that are targets for design between the searched 3D CAD modeling data and the extracted target data.

In checking the consistency of the 3D CAD modeling data and the extracted target data mapped in the present invention, the consistency check includes the dimensions for the height and width of the equipment, the dimensions between the components of the equipment, and the design data of the equipment to be written at the vendor drawing.

In the present invention, Reporting the results of the inspection, changing the 3D CAD modeling data, or providing or transmitting the results to the user, when the consistency check is completed, may include generating a list of the inspection result for the errors of the 3D CAD modeling data, displaying the list on the screen, changing the 3D CAD modeling data having errors according to converted data on the vendor drawing, and transmitting the list for the errors to the user.

Advantageous Effects

The present invention enables engineers to quickly and easily check the RULE by systematically constructing various RULE required in the plant engineering stage, and can increase the perfectionism of the plant design and maximize the cost and time savings of the entire plant construction since can rectify the problems of the RULE violation in the construction process in advance through accurate RULE data.

In addition, the present invention can improve the design quality since can confirm in advance whether the engineering data included in the vendor drawings received at the plant engineering stage is accurately reflected in the design, and has the effect of the cost saving and the reduced construction time since can prevent the construction errors occurring in the plant site during construction.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
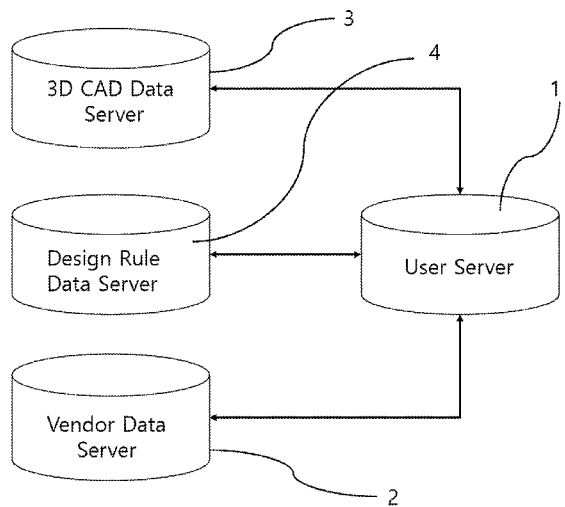
FIG. 1 is a system configuration for improving the design quality according to the present invention.
Figure 2:
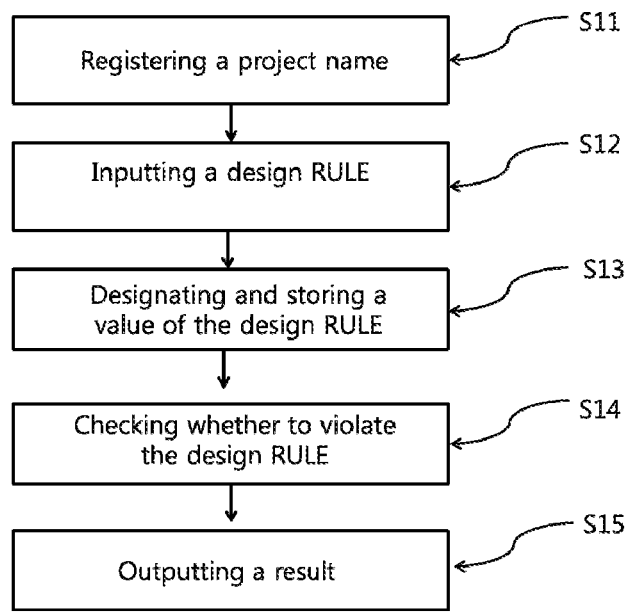
FIG. 2 is a flow chart for design RULE check in accordance with the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

The configuration and operation of an exemplary embodiment of the present invention will be described with reference to the accompanying drawings.

Design quality improvement system through plant engineering consistency check and design RULE check of the 3D CAD model according to the present invention, a vendor data server (2), a 3D CAD data server (3) of 3D CAD TOOL and a design RULE data server (4) and a user server (1) linked thereto.

First, a method of improving design quality of 3D CAD modeling for plant through design RULE check according to the present invention will be described with reference to FIGS. 1 to 22.

As shown in FIG. 1, the system for the design RULE check according to the present invention checks the design RULE to use the design RULE data server (4) and the user server (1) stored 3D CAD modeling data which user designs to use modeling tool data from the 3D CAD data server (3) linked to the design RULE data server (4). That is, it is checked whether 3D CAD modeling is performed according to the design RULE in the user PC, which is the user server (1) linked with the design RULE data server (4).

Specifically, the design quality improvement method of the 3D CAD modeling for plant through the design RULE check comprises: Registering the project name in the design RULE data server (S11); Inputting a design RULE for the registered project by category (S12); Designating and storing a value in the input design RULE (S13); Checking whether to violate the design RULE by applying the design RULE value to 3D CAD model (S14); and Outputting a result of the checked RULE (S15).

First, since the design RULE may vary depending on the project, the project name is registered in the design RULE data server (S11).

Next, after registering the project name, the design RULE is input as the design conditions and design requirements required in the project (S12). The design RULE may include a design RULE required by the client, a design RULE required for each project, and a design RULE according to the specification of the design and construction company. The design RULE is input by category, which is divided into design and engineering sector, operation sector, maintenance sector and safety sector. The design RULE by category can be used as it is or by adding or deleting the basic design RULE registered in the design RULE data server (4). The design RULE basically given to each sector is as follows.
    Design and Engineering
    Wall and Pipe Space
    Pipe and Pipe Space
    Pipe and Flange Clearance
    Flange and Flange Clearance
    Check Valve Direction
    Steam Pipe Drip Leg
    Pump Suction Reducer Type
    Vent Location and Size
    Drain Location and Size
    Flare Header Minimum Slope
    Orifice Plate Minimum Meter-run
    Operation
    Valve Stem Orientation for Fail Safe Valve Operation
    BOP (Bottom of Plane) Elevation of Control Valve Manifold
    Valve Bottom and Floor Space
    Gap between BOP of Bypass and Actuator of Control Valve
    Stairway Headroom Clearance
    Pedestrian Access Way
    Thermal Linear Expansion
    Maintenance
    Pipe Rack Future Space
    Heat Exchanger Maintenance Volume
    Safety
    Fired Heater Valve Location
    Safety Valve Discharge Specifically, the RULE of each sector will be described.

In the design and engineering sectors, the RULE for Wall and Pipe Space means the distance that walls, steel frames and pipes must maintain. It is necessary to have the RULE which pipes should be spaced apart from the wall or steel frame, since if pipes may not maintain a certain distance from the wall or steel frame it is difficult to install insulation or flange on the pipes. The RULE for Pipe and Pipe Space require a minimum amount of space between adjacent pipes and pipes as well, since if the pipes need to be insulated or to be installed with valves or flanges, the gap should be maintained. Therefore, the RULE to maintain the gap between pipes is necessary. Since the diameter of flange is larger than that of pipe, the flange may not be installed to interfere with the adjacent pipe. So, the RULE for Pipe and Flange Clearance is necessary. The RULE for Flange and Flange Clearance is necessary like that of Pipe and Flange Clearance because the diameter of the flange is larger than that of pipe and requires constant gap between flanges when installing pipe ends or valves. In general, when two flanges are installed in a side-by-side pipe, the positions are different from each other so that they do not interfere with each other. However, if the flanges are installed too close, proper clearance is required because the bolts and nuts for tightening the flanges are difficult to install. Check Valve Direction acts as a function of the check valve to move the fluid to one side only, so the whole plant may not work if the check valve is installed in reverse. Therefore, the RULE for Check Valve Direction is necessary. In the case of steam pipe drip leg, steam moves through the pipe and accompanies condensate in moving process, and if the condensate is not removed, two-phase flow of steam and water occurs. Corrosion and water hammering can occur as a result of two-phase flow. Therefore, a drip leg is required to separate condensate and steam at the lowest point of the pipe, and then the RULE for Steam Pipe Drip Leg is required. Pump Suction Reducer Type requires the upper part of the eccentric reducer to be flat on the suction side where the fluid enters the pump. This is to prevent air from being introduced into the pump. In general, in the case where air is included in the fluid flowing into the pump, problems such as cracking of the impellers of the pump due to cavitation may occur. To prevent this, the reducer should be installed so that the top is flat, therefore the RULE for Pump Suction Reducer Type is needed. The RULE for Vent Location and Size and Drain Location and Size is required because a vent must be installed at the highest point and a drain installed at the lowest point. Vents are required to remove air during initial operation, and drains are needed at the lowest point to remove fluid remaining in the pipes when operation is stopped. The RULE for Flare Header Minimum Slope is necessary because the pipe to flare header has liquid in general, which needs to send a flare gas composed of gas and liquid to the flare header by gravity. The function of the flare header burns off the gas produced during operation. The RULE for Orifice Plate Minimum Meter-run is required since an orifice installed in the pipe requires a certain straight line in the front and rear to prevent turbulence in the fluid passing through the orifice. That is, in order to calculate the flow rate of the fluid in the orifice, the fluid flow in the laminar state of a constant speed is required. Usually the front requires 10 times of the pipe diameter and the rear 3 times of the pipe diameter.

In the operation sector, Valve Stem Orientation for Fail Safe Valve Operation requires the operator to close the valve manually if the operation is suddenly stopped. Therefore, the design RULE is necessary because the direction of the valve stem should be located in a place to be easily accessible in case of an operation stop. The BOP Elevation of Control Valve Manifold is a control valve manifold that is installed close to the ground or platform surface for ease of operation. The control valve manifold should be installed so that the bottom of the pipe has the same height as well. In addition, the control valve manifold must be installed at a constant height above ground or platform surface. Therefore, a certain distance from the ground or platform is required, and accordingly the design RULE for BOP Elevation of Control Valve Manifold is required. Elevation of Control Valve Manifold By-Pass has a valve installed in the bypass, which can be difficult to operate when it is installed too high. Therefore the design RULE for Elevation of Control Valve Manifold By-Pass is needed. The RULE for Valve Bottom and Floor Space is required to tighten bolts and nuts to install the valve, because it is difficult to install the valve if it is too close to the floor. Gap between Bop of Bypass and Actuator of Control Valve is necessary to prevent the bypass line and the actuator of the control valve from interfering with each other, therefore the design RULE for Gap between Bop of Bypass and Actuator of Control Valve is required. Stairway Headroom Clearance requires a design RULE because it must be installed so that pipes or devices do not hit the worker's head when they climb the stairs. The Pedestrian Access Way is necessary to secure the movement path of the worker, and therefore requires a design RULE. The RULE for Thermal Linear Expansion is required for the linear expansion of the length of pipe due to the high temperature of the fluid flowing through the pipe, or for the linear expansion of the length of pipe due to the increase of the outside air temperature.

In the maintenance sector, Pipe Rack Future Space requires space because pipe rack installed with a large number of pipes can be installed with temporary pipes for later maintenance. Therefore, the design RULE for Pipe Rack Future Space is needed to secure space. The Heat Exchanger Maintenance Volume needs to be pulled out to maintain the inner tube of the heat exchanger, which requires a space to separate the inner tube from the heat exchanger. Therefore, the design RULE for the Heat Exchanger Maintenance Volume is required.

In the safety sector, the Fired Heater Valve Location must be in a safe position to shut off the fluid to the heater because the heater is constantly heated and there is a risk of explosion or fire. Therefore the design RULE for the Fired Heater Valve Location is required. Safety Valve opens and releases fluid through the safety valve discharge when it is above a certain pressure by pressure or other factors in the pipeline. This is dangerous because high pressure fluid is released. Therefore, the position of the outlet of the safety valve needs to be present in a location that is inaccessible to the operator, and thus the design RULE for Safety Valve Discharge is required.

Next, a value is designated and stored in the design RULE (S13). Design RULE value is designated a certain value, such as constant value, whether to install and size, etc., and is designated the value required in the design RULE described above.

As illustrated in FIG. 1, the user may store and use the pipe routing type to which the design RULE is applied in the 3D CAD modeling data created by the user in the design RULE data server (4). Therefore, a design engineer who is a user for the same pipe routing type can call up the saved piping routing type and apply it to the design. In addition, the design RULE value may be designated using a predetermined routing type object according to the type, direction, and position of each piping component stored in the design RULE data server (4). In addition, the design engineer may recognize, store and use the type of the machine to which the design RULE is applied in the 3D CAD modeling data in the design RULE data server (4). If one type for piping or machine is saved and registered, the engineer can down load and use the stored type for a same type, which makes work easier. In addition, after recognizing the characteristics of components such as tag rules and nozzles of each machine in the 3D CAD modeling data, the design RULE data server (4) compares each machine with a machine of a predetermined type and uses a matched type, or saves and reuses machine of matched type. It also designates the type and location information that a piping component such as vent, drain, or drip leg should be installed. It also designates the distance or spacing between one component and another adjacent component. For example, it designates values for a certain distance between pipes and a distance between pipe and flange. It also designates the engineering values that must be observed for one component. For example, it designates a value such as an orifice meter-run. It also designates the position values of the components required in operation such as the position of the valve stem. In addition, it is possible to designate the volume for the workspace and the movement route for the operator's operation and the space required for later maintenance such as a pipe rack.

Next, the design RULE having the designated value is applied to the 3D CAD modeling data to check whether to violate the design RULE (S14). As shown in FIG. 1, the design RULE data server (4) checks whether to apply or violate the design RULE for the component to which the design RULE is applied.

Specifically, the design RULE data server (4) recognizes the dimension, direction and spatial information of one component and the dimension, direction and spatial information of another adjacent component from 3D CAD modeling data, and checks whether to violate by comparing the designated RULE value with the distance or the interval between the one component and another adjacent component.

In addition, the design RULE data server (4) extracts the highest point and the lowest point to use the three-dimensional points where the faces meet each other for the components to which the virtual volume design RULE is applied, such as stairs, movement paths, and workspaces, which are arranged on the platform of the structure in the 3D CAD modeling data. Using the extracted highest point and the lowest point, the design RULE data server (4) calculates the width and height to determine the volume of the work space and movement path for the operator's operation and the volume required for future maintenance. The design RULE data server (4) Checks whether to violate by comparing the volume determined from the 3D CAD modeling data with the design RULE value of the design RULE data server (4).

In addition, the design RULE data server (4) extract pipe or tube information and confirm the highest or the lowest on the line of the pipe or the tube in 3D CAD modeling data for components to which the design RULE of the installation type and installation location of component is applied such as vent, drain or drip leg. The design RULE data server (4) checks whether to violate the design RULE by confirming whether to install the component and the type of component at the identified lowest and highest point such as vent, drain, or drip leg.

Specifically, it will be described with reference to the drawings.

FIG. 4 to FIG. 10 are diagrams illustrating the RULE check items in the design and engineering sector according to the present invention.

Figure 4:
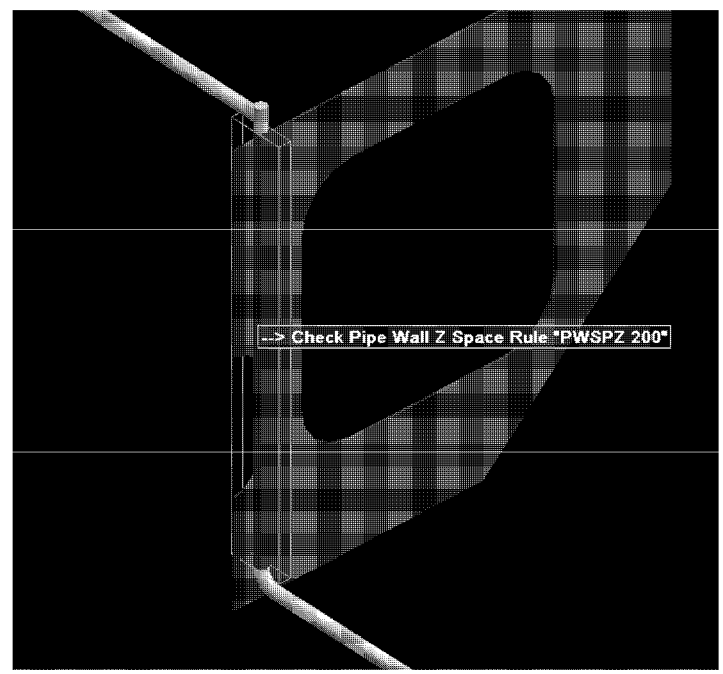
FIG. 4 to FIG. 10 illustrate the RULE check in the design and engineering sector in accordance with the present invention.

FIG. 4 shows RULE violations for the space between the pipe and the wall. For example, the separation distance between the pipe and the wall should be at least 200 mm, which is the value designated in the RULE. If not, the RULE violation will be marked on the drawing.

Figure 5:
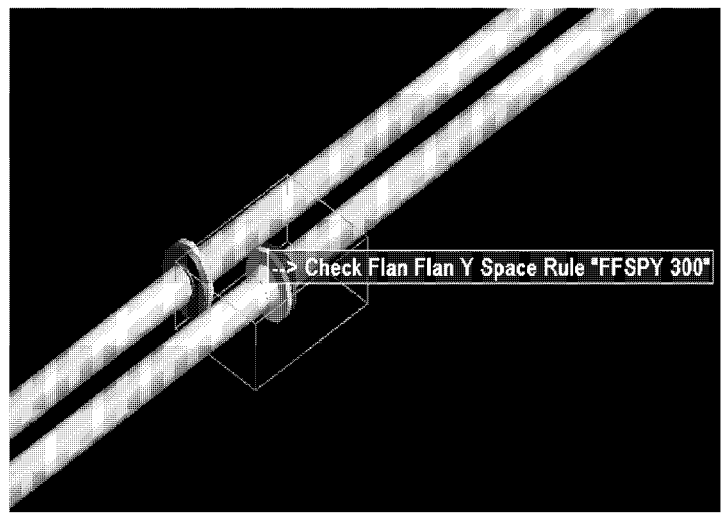

FIG. 5 shows a case in which the constant distance between the flange and the flange should be maintained, but not maintained by the constant distance. In this case, the space according to the dimension and direction of one flange is recognized to check the separation distance from the other flange. That is, if another flange is located in the space of the recognized flange, it is indicated in the drawing as a design RULE violation.

Figure 6:
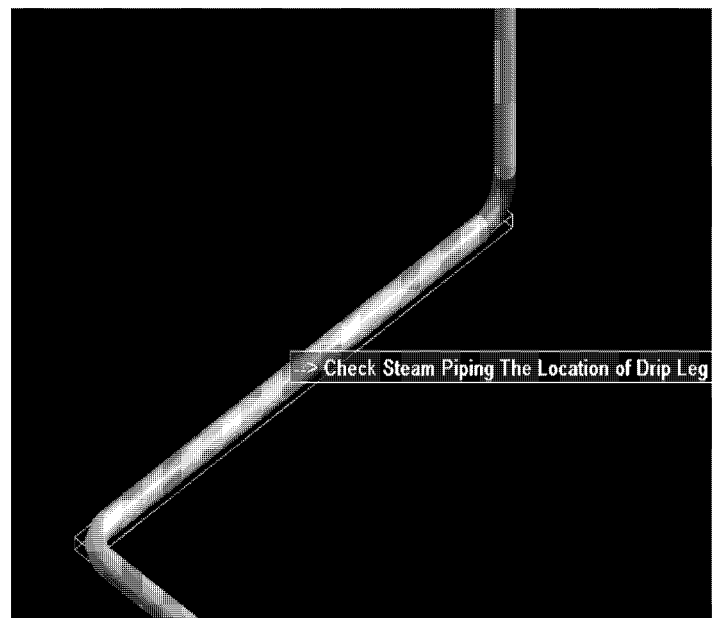
Figure 7:
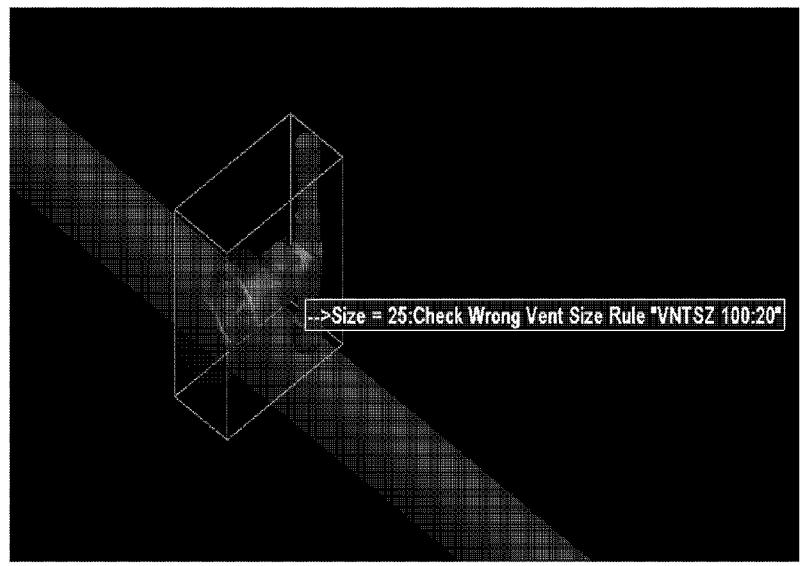
Figure 8:
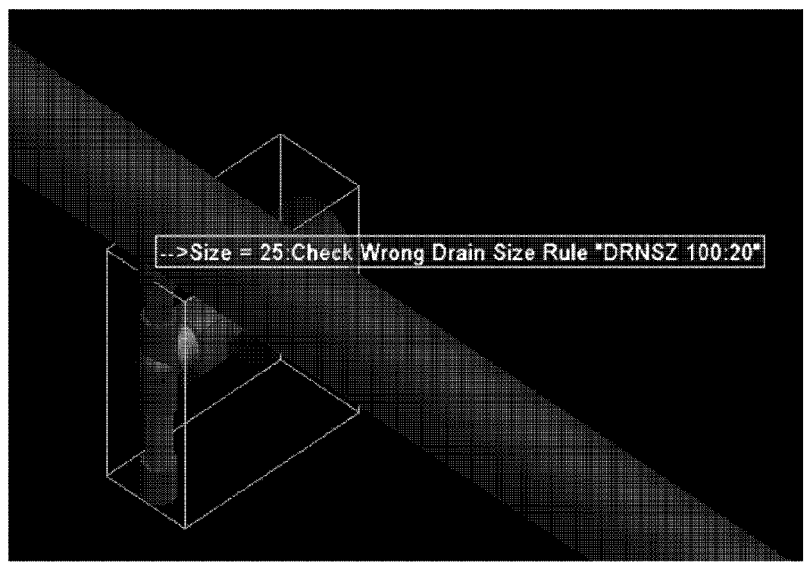

FIG. 6 shows that a drip-leg is not installed in the steam pipe and is marked as a RULE violation. Since the drip leg of the steam pipe should be installed at the lowest point of the pipe, the design RULE data server (4) recognizes the lowest point from the 3D CAD modeling data, and if the drip leg is not installed at the recognized lowest point, the drawing will be shown by a violation. In addition, the pipe size of the drip leg may be listed in the design RULE data, and whether or not the size is the same as the listed size is checked. FIG. 7 and FIG. 8 is diagram for the vent and drain, it is determined whether to violate in the same way as the drip leg of the steam pipe.

Figure 9:
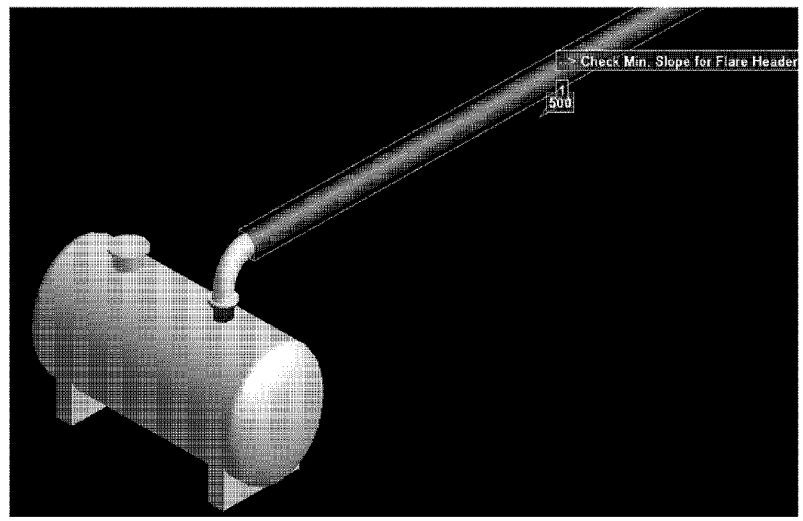

FIG. 9 shows a flare head piping heading to a flare stack. The design RULE data server (4) recognizes a flare head pipe dimension, a direction, and a space, for confirming that the head pipe has a minimum gradient, and checks whether to violate the RULE.

Figure 10:
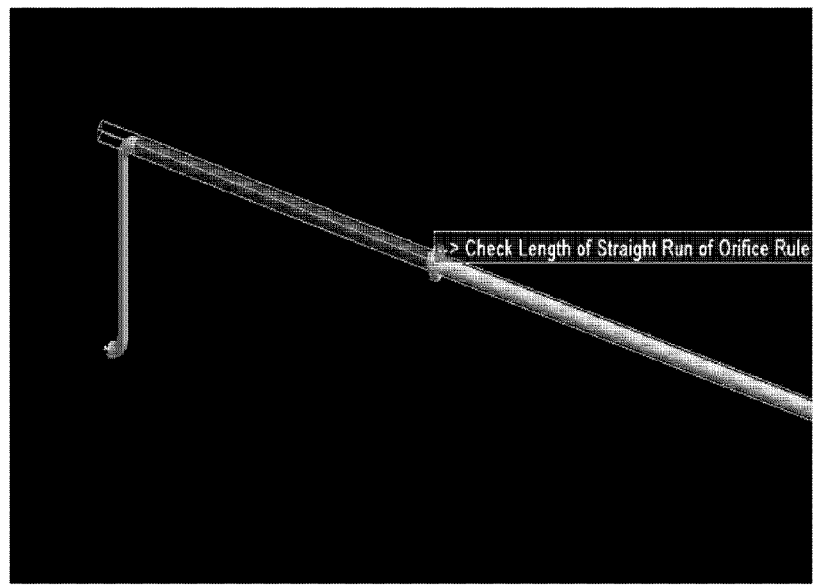

FIG. 10 shows whether or not a meter-run violation occurs in a pipe in which an orifice is installed. The design RULE data server (4) recognizes the dimension, direction, and space of the pipe that an orifice is installed in 3D CAD modeling data, and checks the front and rear straight distance of the orifice. If it is smaller than the value defined in the design RULE value, the violation is indicated in the drawing.

Figure 11:
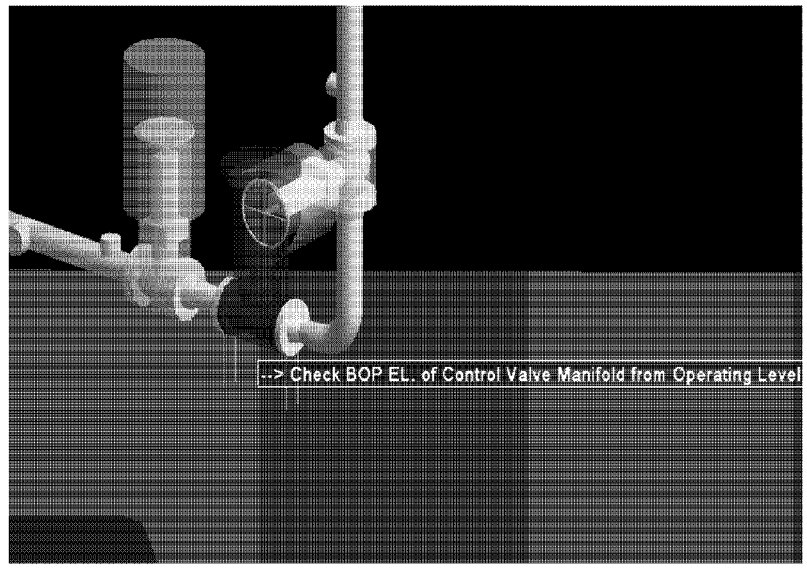
FIG. 11 to FIG. 16 are diagrams illustrating the RULE check in the operation sector according to the present invention.
Figure 12:
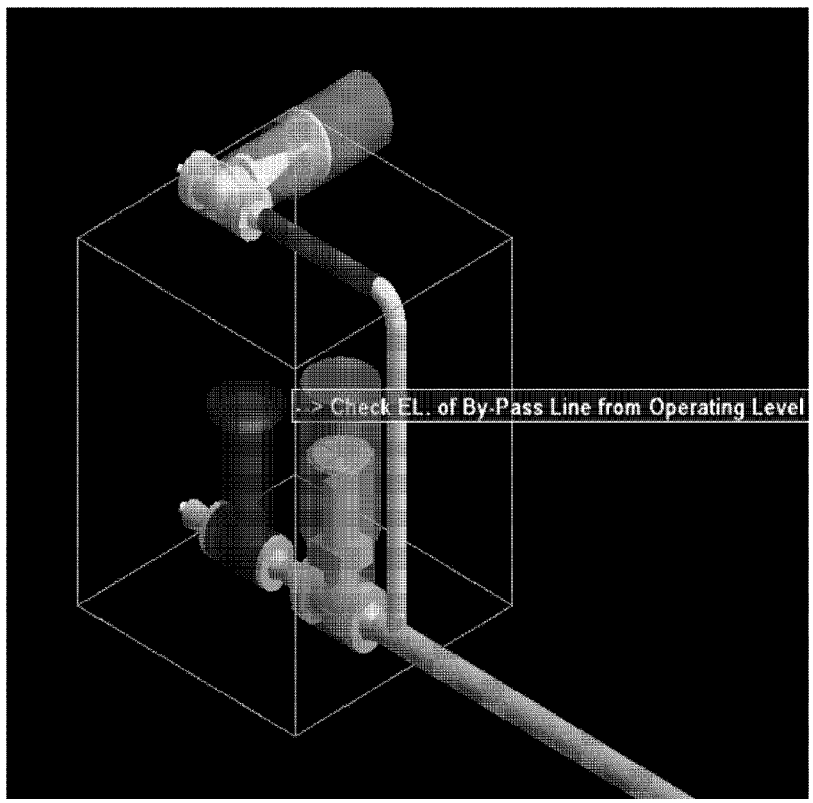
Figure 13:
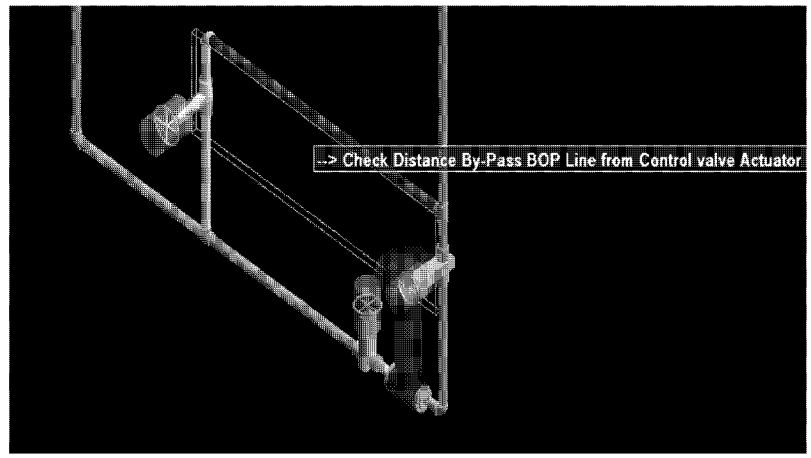
Figure 14:
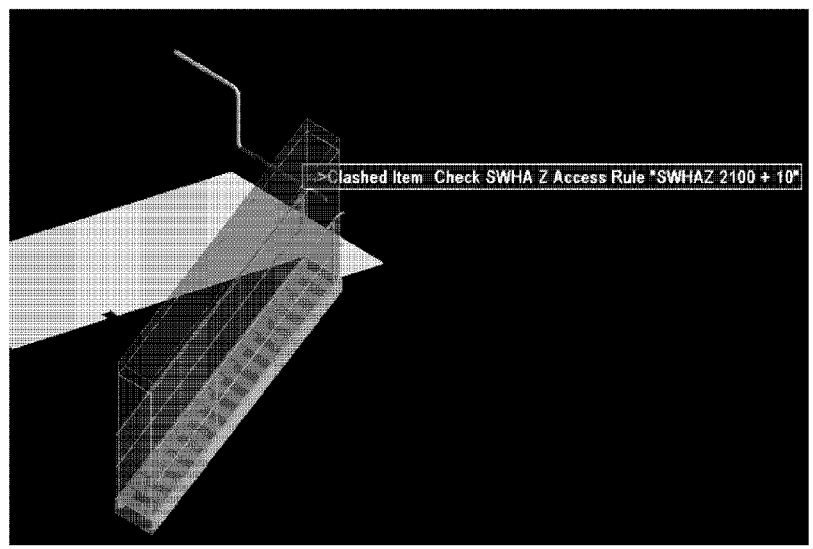
Figure 15:
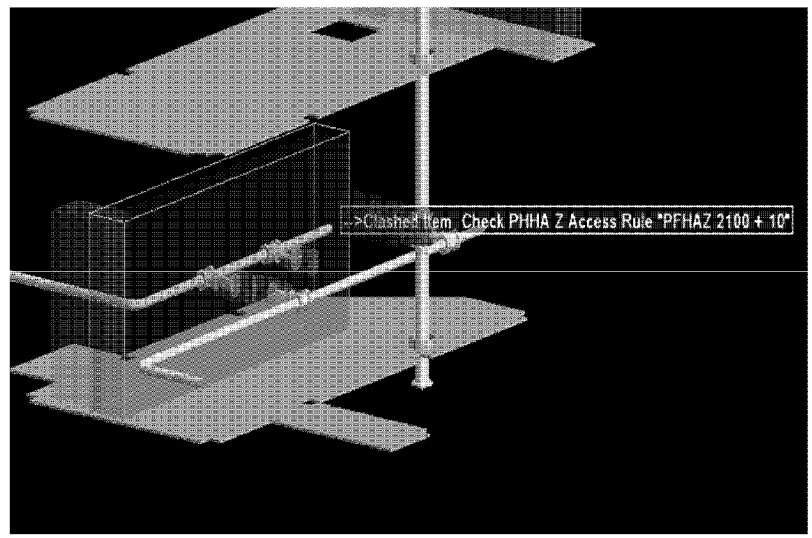
Figure 16:

FIG. 11 to FIG. 16 are diagrams illustrating the RULE check item in the operation sector according to the present invention. As FIG. 11 to FIG. 13 are all about the control valve manifold, FIG. 11 shows the violation by checking whether the BOP of the control valve manifold is the same. FIG. 12 shows the violation of the Bypass line by checking whether the valve is installed in an operable position. FIG. 13 shows the violation by checking whether the bypass line and the actuator of the control valve have a predetermined distance. FIG. 11 shows to recognize the location of the valve in the 3D CAD modeling data, and to check whether the recognized location value of the valve is in violation of the RULE. FIG. 12 shows to recognize the valve location of the bypass valve, and to check whether the valve location value is in violation of the RULE like FIG. 11. FIG. 13 shows to determine the volume by recognizing the highest point of the actuator and the lowest point of the bypass line, and to check whether the constant distance between the bypass line and the actuator through the determined volume is in violation of the RULE. FIG. 14 to FIG. 16 are diagrams for checking whether the RULE violation of the stairs and the movement route in the operation sector. FIG. 14 to FIG. 16 shows to recognize the lowest and the highest points of stairs and moving paths in 3D CAD modeling data, to determine width and height using recognized the lowest and the highest points, and to check whether to violate the design RULE by comparing the determined value with the design RULE value.

Figure 17:
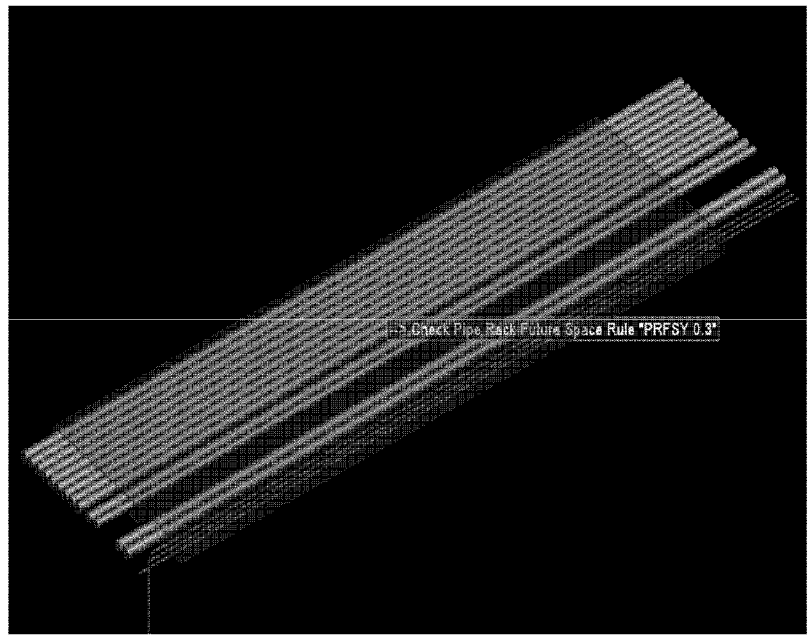
FIG. 17 to FIG. 18 are diagrams illustrating the RULE check in the maintenance sector according to the present invention.
Figure 18:
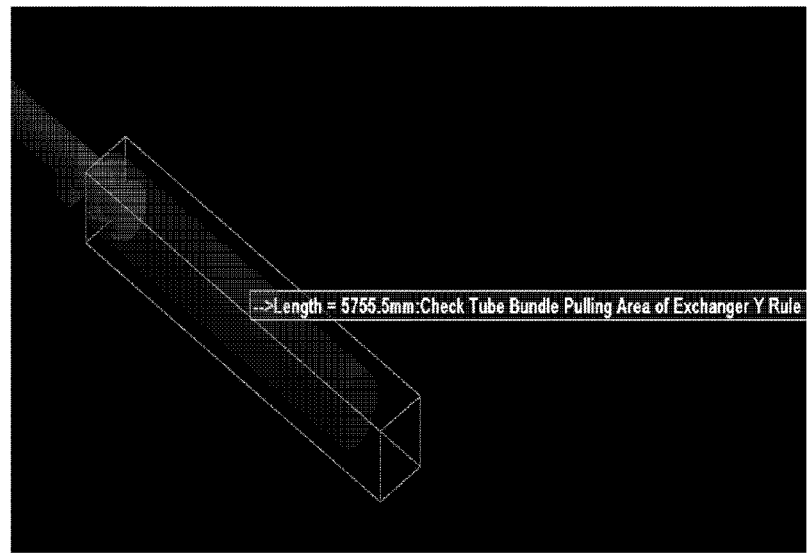

FIG. 17 and FIG. 18 are diagrams illustrating the RULE check in the maintenance sector according to the present invention. FIG. 17 shows whether to violate by checking whether there is a space for later maintenance on the pipe rack, and FIG. 18 shows whether to violate by checking whether there is a space when removing the inner tube of the heat exchanger for maintenance. As shown in the figures, the virtual volume is formed for the corresponding component in the 3D CAD modeling data and compared with the design RULE value to determine whether to violate.

Figure 19:
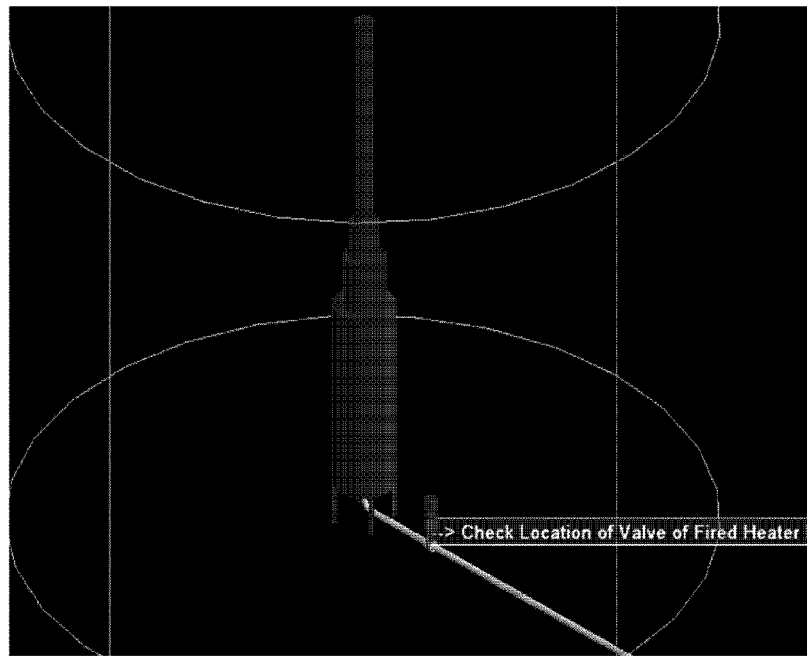
FIG. 19 is a diagram illustrating a RULE check in the safety sector according to the present invention.

FIG. 19 shows to explain a RULE check in the safety sector according to the present invention. As shown in the figure, the virtual volume of the safety range is determined from the heater, and whether to violate the RULE is checked by confirming whether the valve is located in the determined volume.

Figure 20:
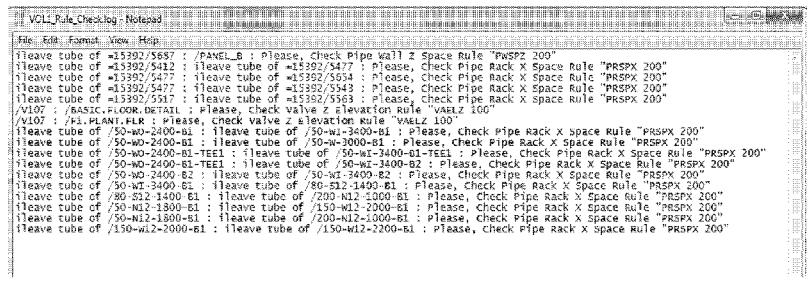
FIG. 20 to FIG. 22 are output as a result of the RULE check in accordance with the present invention.
Figures 21, 22:
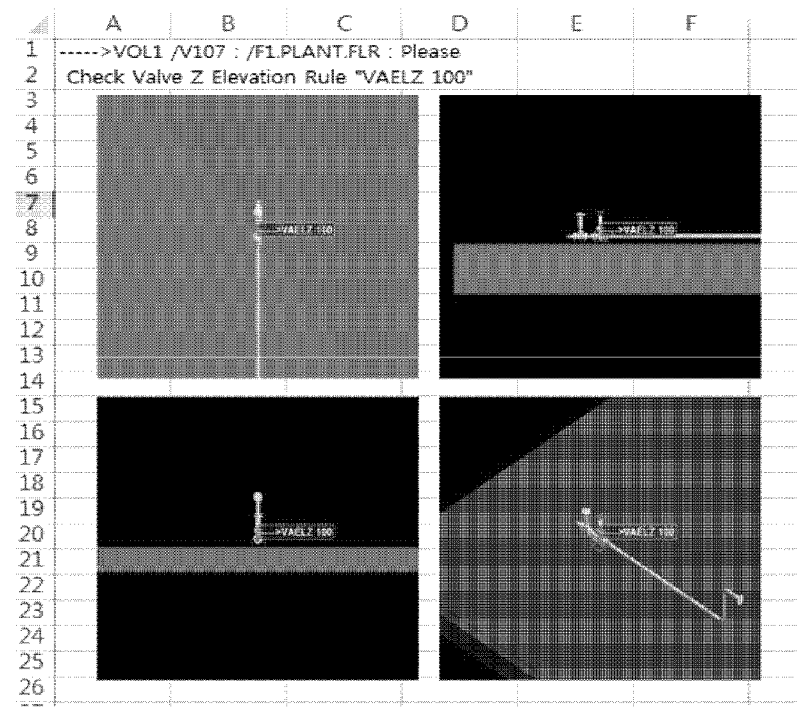

FIG. 20 to FIG. 22 show the result of checking the design RULE. FIG. 20 is a log file as a result, FIG. 21 is an Excel file including a 3D CAD image, and FIG. 22 is a list showing each violation item.

Figure 3:
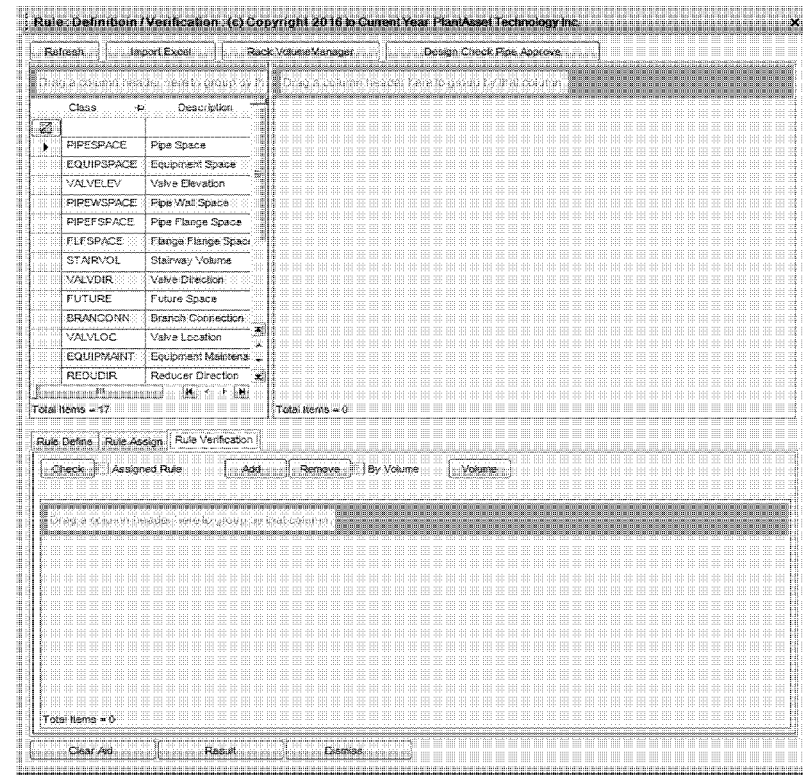
FIG. 3 illustrates a U/I for design RULE check in accordance with the present invention.

FIG. 3 is a diagram of U/I for design RULE check according to the present invention. As shown in the figure, it is possible to designate a value for the design RULE described in the U/I.

Next, the engineering data consistency check method of the 3D CAD model for plant engineering will be described.

First, the data consistency checking system of a 3D CAD model for plant engineering according to the present invention will be briefly described with reference to FIG. 1. The consistency checking system of the 3D CAD model according to the present invention, as shown in FIG. 1, the vendor data server (2), 3D CAD data server (3) of the 3D CAD TOOL, the design RULE data server (4) and the user server (1) linked thereto. The user server (1) can access to each server, and upload and download data if necessary.

Figure 23:
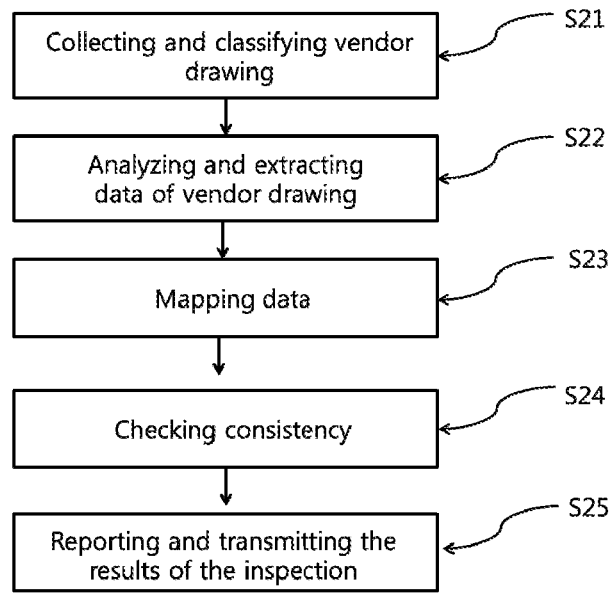
FIG. 23 is a flow chart of the consistency check method according to the present invention.

As shown in FIG. 23, the method for checking the consistency between the 3D CAD model and the vendor drawings for the plant engineering according to the present invention using the servers, (a) Collecting and classifying vendor drawings submitted in the form of a file by the equipment manufacturer or equipment supplier (S21); (b) Analyzing data by data mining techniques and extracting target data from the collected and classified vendor drawings (S22); (c) Searching 3D CAD modeling data matched with the extracted target data and mapping the searched 3D CAD modeling data and the extracted target data (S23); (d) Checking the consistency between the mapped 3D CAD modeling data and the extraction target data (S24); and (e) Reporting the results of the inspection, changing the 3D CAD modeling data, or providing or transmitting the results to the user, when the consistency check is completed (S25).

First, the vendor data server (2) collects and classifys vendor drawings submitted in the form of files by equipment manufacturers or equipment suppliers (S21). Equipment includes a variety of devices and special devices, such as vessels, drums, tanks, reactors, towers, or control valves, and various specialty devices. In plant engineering, these various devices are connected to each other through piping. In addition, the piping may be equipped with control valves, various type valves or instrumentation equipment. Piping typically generates piping fabrication drawings from 3D CAD models, and direct pre-fabricated pipe spool work for piping can be done in a warehouse or pipes are installed on plant site using the piping fabrication drawings. If there is no error in the 3D CAD model, the installation of these pipes does not need to be repeated, but if the nozzle information or the position information of the device such as the vessel does not match with vendor drawing, the pre-fabricated pipe spool needs to be refabricated. Those cause problems to add to time and cost, and therefore, the various dimensions of the 3D CAD model and the vendor drawings need to be exactly matched. As a result, vendor drawings must be collected and sorted at an updated time. Vendor drawings are usually submitted in the form of PDF files. Therefore, it is necessary to collect, classify and store information on manufacturers and equipment types from PDF files, which can be obtained from vendor data server.

Figure 24:
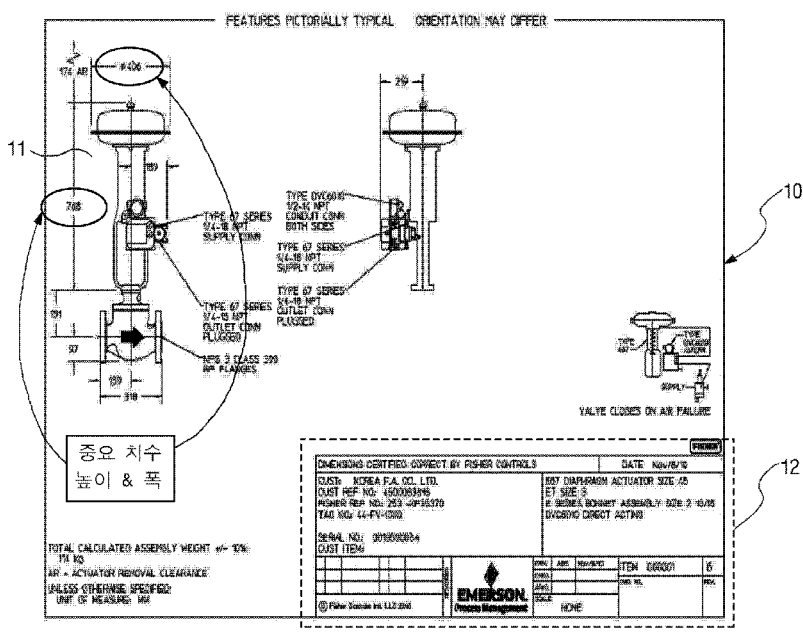
FIG. 24 is a vendor drawing of a control valve in accordance with the present invention.
Figure 25:
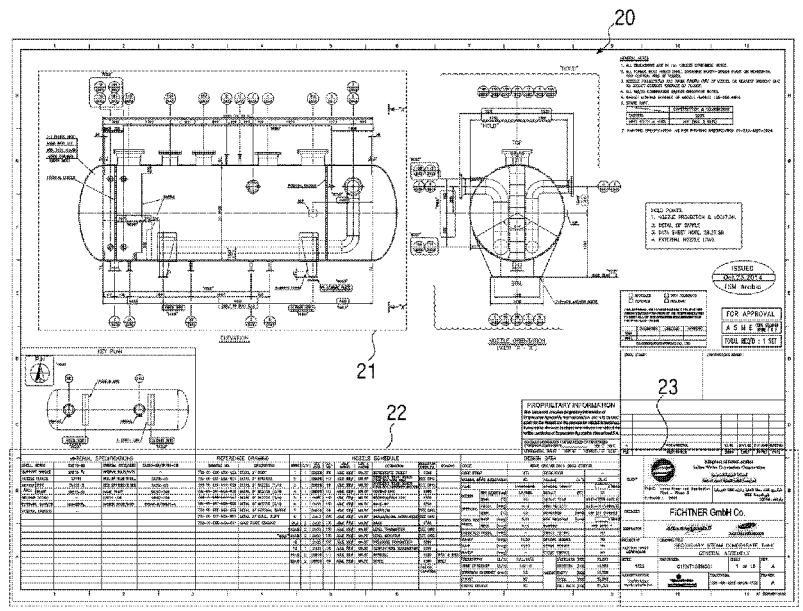
FIG. 25 is a vendor diagram of a vessel in accordance with the present invention.
Figure 26:
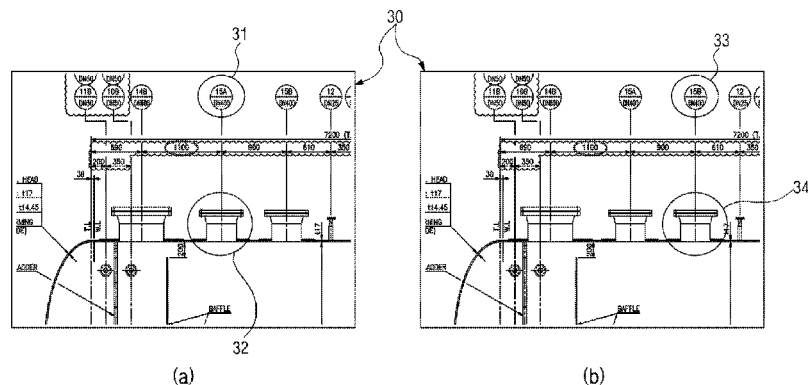
FIG. 26 illustrates a method of extracting data from a vendor drawing utilizing data mining techniques in accordance with the present invention.
Figure 27:
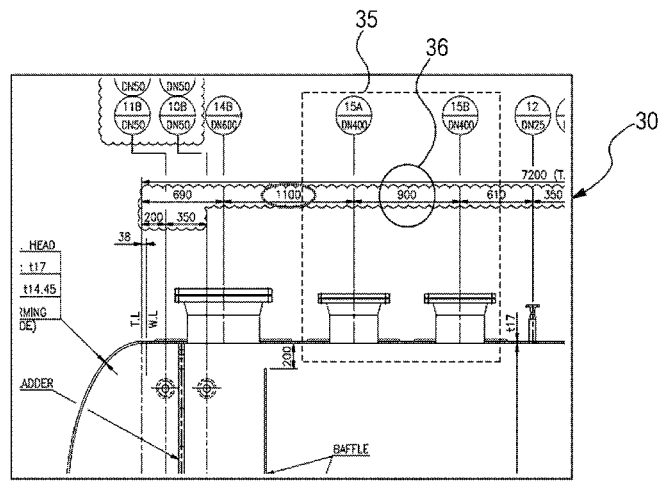
FIG. 27 is a diagram of necessary data obtained through the data extraction method of FIG. 26, FIG. 28 to FIG. 33 show an example of a consistency test result report.

Next, the data is analyzed and extracted by data mining techniques from the collected and classified vendor drawings (S22). FIG. 24 and FIG. 25 show a vendor drawing. FIG. 24 shows a vendor drawing (10) of the control valve, and FIG. 25 shows a vendor drawing (20) of the vessel. As shown in FIG. 24, the main data may be data (11) for the size and shape of the control valve and data (12) for a supplier or a manufacturer and a name in the control valve vendor drawing (10). As shown in FIG. 25, the vessel vendor drawing (20) may be divided into an area (21) for dimensions and drawings, a data area (22) for design data, and a data area (23) for a supplier or a manufacturer and a name of vessel. And the data for those parts are needed in vessel vendor drawing (20). In analyzing and extracting data by the data mining technique, the step comprises extracting the dimension and shape data of the two-dimensional drawing and various text information data on the drawing for the equipment from the vendor drawings collected and classified by the manufacturer and the equipment type, and extracting necessary targeted data by analyzing and purifying the extracted data. First, it is necessary to extract the dimension and shape data of the 2D drawing and the design information data of the drawing from the vendor drawings collected and classified by the manufacturer and the equipment type so that they can be matched with the actual 3D CAD data. The data related to design need to be extracted from vendor drawing thereafter. The design-related data is design-related data of equipment related to dimensions and fabrication. Design-related data extracts necessary data at first, recognizes the extracted data as a pattern, and identifies whether it is a nozzle or a manhole etc., according to various patterns. After grasping a component by patterns, the target component is found out whether it is a nozzle, etc. After mapping the dimension of the target component for the 3D CAD model and vendor drawing, it creates a list in XML file and extracts the necessary data. Reading various patterns of equipment enables the vendor data server (2) to learn patterns for various shapes of nozzles etc., using deep learning techniques. Or the vendor data server (2) can learn the patterns for other components that are mounted on the device, and can mine the data to need for each component. FIG. 26 illustrates a method of mining a nozzle and its shape from the vendor drawing (30). At first, the shape and dimensions of one of the components are extracted from the dimension and drawing portion of the vendor drawing, and then the shapes and dimensions of the other components are extracted. As shown in the figure, by reading the nozzle tag (31), the corresponding component is recognized as a nozzle, and the information (32) on the shape of the nozzle is also extracted. In addition, other nozzles are recognized in the same manner as the component (33) called a nozzle, and the dimension and shape (34) of the nozzle are recognized and extracted. As shown in FIG. 27, the extracting data by the data mining technique is completed by reading the extracted two nozzle regions (35) and the distance (36) between the two nozzles, that is, the dimension. The extracted data is converted into XML data and stored.

Next, 3D CAD modeling data matched with the extracted target data is searched, and the searched the 3D CAD modeling data and the extracted target data are mapped (S23). The extracted target data is listed and stored in an XML file. In order to compare the stored data with the 3D CAD modeling data, the 3D CAD modeling data matched with the converted XML data of the vendor drawing must be searched. To searching the 3D CAD model data, the area of the equipment with the extracted target data and the name data of the equipment are used as keywords. The name of the equipment and the area (Unit or Area) in which the equipment is located in the drawing are input to the 3D CAD data server (3) to search 3D CAD modeling data matched. Mapping the 3D CAD modeling data searched from the 3D CAD data server (3) and the extracted target data is performed by mapping components for design between the searched 3D CAD modeling data and the extracted target data. In other words, the nozzles with the same tag are mapped to each other, and the same components are mapped to each other by identifying the shapes modeled in 3D CAD together.

Next, the consistency between the mapped 3D CAD model data and the extraction target data is checked (S24). When mapping of the corresponding components is completed, the data is compared with each other, and the consistency between the data described in the latest vendor drawings and the 3D CAD model data is checked. The target of consistency check may be the dimensions of the height and width of the equipment, the dimensions of distance between the components of the equipment, design data of the equipment components described in the vendor drawings, etc. In addition, the design data required for the fabrication of the equipment may also be targeted. In other words, which material used for the nozzle, and whether a suitable flange is used according to the allowable stress of the nozzle may be the target of consistency check. This is because the interval between bolts and the number of bolt holes vary depending on the allowable load of the flange. For example, flanges that can withstand 150 lb allowable loads must be fitted with pipe spools with flanges that can withstand the same allowable loads.

Figure 28:
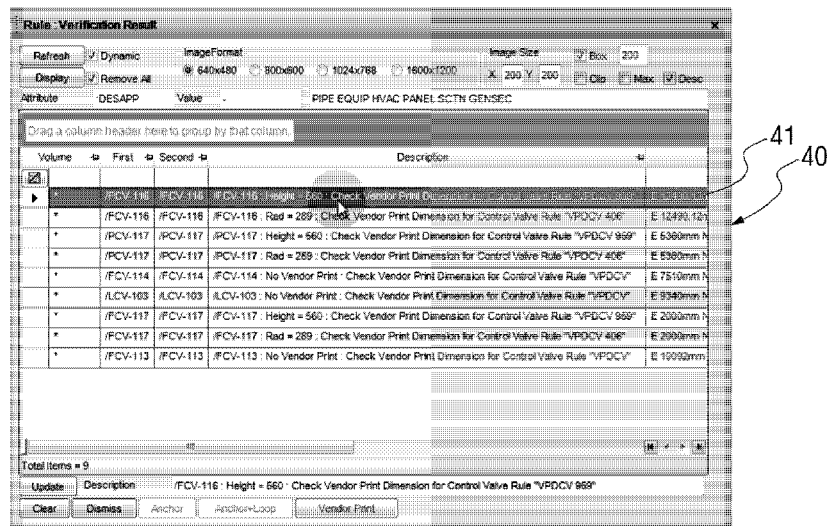
Figure 29:
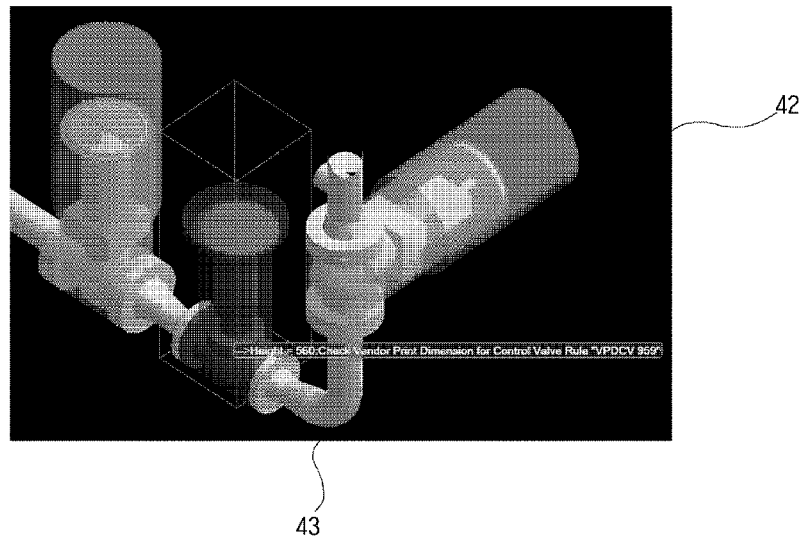
Figure 30:
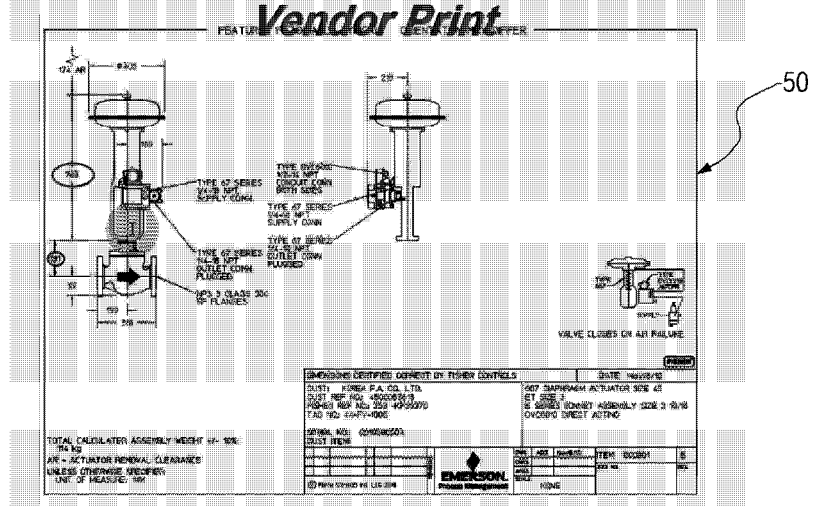
Figure 31:
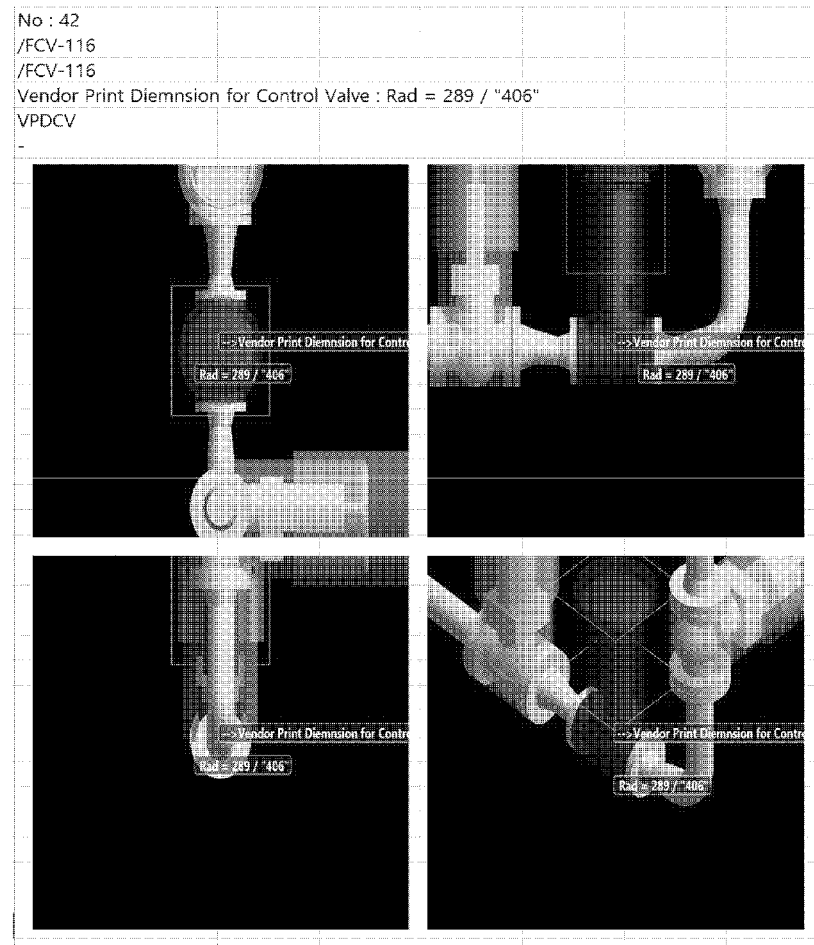
Figure 32:
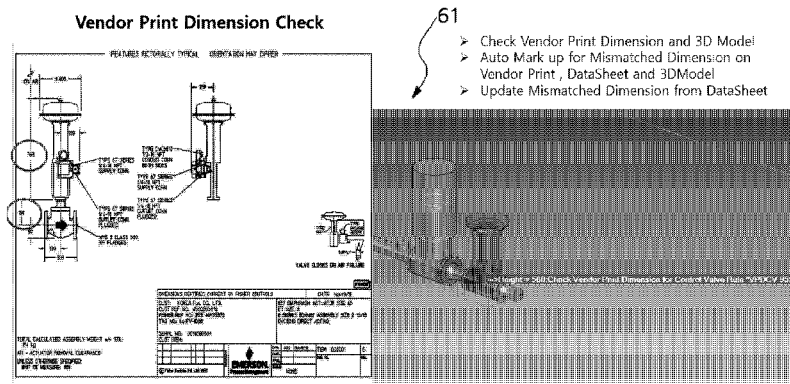
Figure 33:
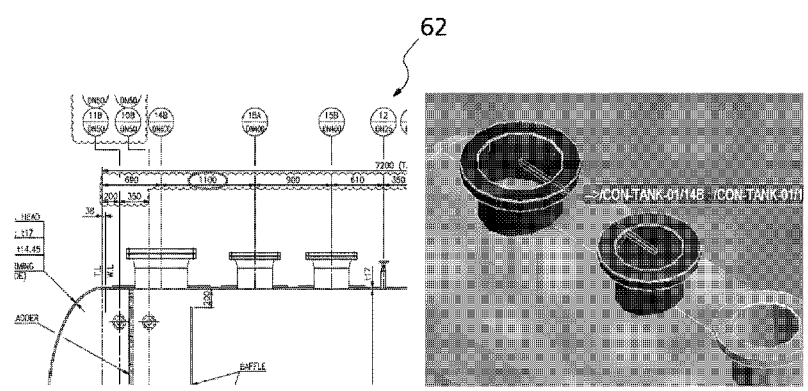

Next, when the consistency check is completed, the results are reported, and the 3D CAD modeling data are changed, or the results are provided or transmitted to the user (S25). FIG. 28 to FIG. 33 show diagrams according to the result of the consistency check. First, FIG. 28 shows the result of the consistency check as a list (40). After the consistency check, the check result list for the component having an error is displayed, and when a specific component (41) is clicked, the screen of FIG. 29 appears and the error part is displayed in a different color from other parts of the drawing (for example, Only the control valve is displayed in red). In addition, as illustrated in FIG. 30, the vendor drawing associated with the error part (43) may be linked together to display the link area (50). FIG. 31 shows an example of a list (60) sent to a user. The list (60) can be sent to user with the form of an Excel file along with a highlighted screen of the error. FIG. 32 and FIG. 33 illustrate changes in 3D CAD modeling according to the vendor drawings, and request to check inconsistencies between the vendor drawings and the 3D CAD modeling as shown in the figures.

As described above, according to the design quality improvement method of the plant 3D CAD modeling through the design RULE check according to the present invention, there is an advantage that the design quality can be improved by checking whether the design RULE is violated before construction. In addition, since the routing type with a predetermined design RULE value can be used at the design stage, the RULE violation can be eliminated in advance, thereby saving time according to the RULE check. In addition, modeling engineers can easily check for RULE violations and design as a routing type or a mechanical device with a predesigned RULE value if necessary, thereby reducing the design time.

In addition, since the error portion can be caught in advance through the consistency check between the 3D CAD modeling data and the extracted target data from the vendor drawings, the construction cost is reduced along with the error correction during plant construction, the construction period can be shorten.

As described above, the present invention can be variously modified and described, but preferred embodiments of the present invention have been described. However, the present invention is not limited to these embodiments, and the technical field to which the present invention belongs in the claims and the detailed description of the present invention. It will be appreciated that the techniques that can be used by those skilled in the art can be naturally included in the technical scope of the present invention.

What is claimed is:

1. In a design error prevention method through consistency check and design RULE check of 3D CAD model of engineering data for plant engineering using a design RULE data server, a vendor data server and a 3D CAD modeling data server,
   (a) Checking whether to reflect the design RULE to 3D CAD model comprises: Registering a project name with the design RULE data server; Inputting a design RULE for the registered project by a category of categories including design and engineering sector, operation sector, maintenance sector and safety sector; Designating and storing a value in the input design RULE; Checking whether to violate the design RULE by applying the design RULE value to the 3D CAD model; and Outputting a result of the checked design RULE; and
   (b) Checking engineering data consistency of the 3D CAD model comprises: Collecting and classifying vendor drawings submitted in the form of a file by an equipment manufacturer or an equipment supplier; Analyzing data by data mining techniques and extracting target data from the collected and classified vendor drawings; Searching 3D CAD modeling data matched with the extracted target data and mapping the searched 3D CAD modeling data and the extracted target data; Checking the consistency between the mapped 3D CAD modeling data and the extraction target data; and Reporting results of an inspection, changing the 3D CAD modeling data, or providing or transmitting the results to a user, when the consistency check is completed,
   wherein the design RULE in the design and engineering sector category includes design compliance of wall and pipe space, pipe and pipe space, pipe and flange clearance, flange and flange clearance, check valve direction, steam pipe drip Leg, pump suction reducer type, vent location and size, drain location and size, flare header minimum slope, and orifice plate minimum meter-run,
   wherein the design RULE in the operation sector category includes design compliance of valve stem orientation for fail safe valve operation and the BOP (Bottom of Plane) elevation of control valve manifold for safe operation of a valve, valve bottom and floor space, a gap between BOP of bypass and actuator of control valve, stairway headroom clearance, pedestrian access way, and thermal expansion,
   wherein the design RULE in the maintenance sector category includes design compliance of pipe rack future space, heat exchanger maintenance volume, and
   wherein the design RULE in the safety sector category includes design compliance of fired heater valve location and safety valve discharge design.

2. The method of claim 1,
Wherein the design RULE by category can be used as it is, added or deleted in a design RULE registered in the design RULE data server.

3. The method of claim 1,
Wherein designating and storing the design RULE value is designating and storing the design RULE value to a pipe routing type to which the design RULE is applied in the 3D CAD modeling data, or designating and storing the design RULE value to a predetermined routing type object according to type, direction and location of each piping component in the design RULE data server.

4. The method of claim 1,
Wherein designating and storing the design RULE value is designating and storing the design RULE value to a machine type to which the design RULE is applied in the 3D CAD modeling data, or designating and storing the design RULE value to a machine type which is matched with a predetermined machine type in the design RULE data server after it is recognized by characteristics of tag rules and nozzles which are components of each machine.

5. The method of claim 2,
Wherein designating and storing the design RULE value includes designating a type and a position value which vents, drains or pipe drip legs as piping components should exist, designating a distance or a span between one component and another adjacent component, designating engineering values to be observed for one component, designating position values of the components required for operation, designating a volume for a workspace and movement path for an operator's operation, or designating a volume required for maintenance.

6. The method of claim 1,

Wherein checking whether to violate the design RULE includes recognizing dimension, direction and spatial information of one component and dimension, direction and spatial information of another adjacent component from the 3D CAD modeling data and checking whether to violate by comparing the designated design RULE value with a value of a distance or a span between one component and another adjacent component.

7. The method of claim 1,

Wherein the vendor drawings are submitted by the form of a PDF file, and the information on the manufacturer and equipment type is collected and classified from the PDF file.

8. The method of claim 7,

Wherein analyzing and extracting data by a data mining technique includes extracting dimension and shape data of a two-dimensional drawing for equipment and various text information data of the drawing from vendor drawings collected and classified by manufacturer and equipment type; and filtering and extracting the extracted data into necessary target data by analyzing the extracted data.

9. The method of claim 8,

Wherein searching 3D CAD modeling data matched with the extracted target data includes searching 3D CAD modeling data that is matched using as keywords data for an area of the equipment and a name of the equipment, and mapping of the searched 3D CAD modeling data and the extracted data includes mapping elements that are targets for design between the searched 3D CAD modeling data and the extracted target data.

10. The method of claim 9,

Wherein the consistency check includes a dimensions for a height and width of the equipment, dimensions between components of the equipment, and design data of the equipment to be written at the vendor drawings.

11. The method of claim 10,

Wherein reporting the results of the inspection, changing the 3D CAD modeling data, or providing or transmitting the results to the user, when the consistency check is completed, includes generating a list of the inspection results for errors of the 3D CAD modeling data, displaying the list on a screen, changing the 3D CAD modeling data having errors according to converted data on the vendor drawings, and transmitting the list for the errors to the user.

* * * * *